(12) United States Patent
Hui et al.

(10) Patent No.: US 6,635,943 B1
(45) Date of Patent: Oct. 21, 2003

(54) METHOD AND SYSTEM FOR REDUCING CHARGE GAIN AND CHARGE LOSS IN INTERLAYER DIELECTRIC FORMATION

(75) Inventors: Angela T. Hui, Fremont, CA (US); Tuan Duc Pham, Santa Clara, CA (US); Richard J. Huang, Cupertino, CA (US); Mark T. Ramsbey, Sunnyvale, CA (US); Lu You, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/533,617

(22) Filed: Mar. 22, 2000

Related U.S. Application Data

(60) Provisional application No. 60/168,268, filed on Nov. 30, 1999.

(51) Int. Cl.[7] .................................................. H01L 29/00
(52) U.S. Cl. .................... 257/506; 257/314; 257/315; 257/316; 257/317; 257/318; 257/319; 257/320; 257/321; 257/322; 257/323; 257/390
(58) Field of Search .............................. 257/314–325, 257/390, 506

(56) References Cited

U.S. PATENT DOCUMENTS

| | | | | |
|---|---|---|---|---|
| 5,268,321 A | * | 12/1993 | Shimizu et al. | 437/52 |
| 5,598,028 A | * | 1/1997 | Losavio et al. | 257/644 |
| 5,627,403 A | * | 5/1997 | Bacchetta et al. | 257/639 |
| 5,847,464 A | * | 12/1998 | Singh et al. | 257/752 |
| 6,177,716 B1 | * | 1/2001 | Clark | 257/532 |
| 6,242,299 B1 | * | 6/2001 | Hickert | 438/240 |
| 6,265,294 B1 | * | 7/2001 | Park et al. | 438/533 |
| 6,300,229 B1 | * | 10/2001 | Tanaka et al. | 438/584 |
| 6,326,299 B1 | * | 12/2001 | Homma et al. | 438/633 |
| 6,355,182 B2 | * | 3/2002 | Thakur et al. | 216/57 |
| 6,221,773 B1 | * | 4/2002 | Yasui et al. | 438/690 |

FOREIGN PATENT DOCUMENTS

| | | | |
|---|---|---|---|
| JP | 5-259296 | * | 10/1993 |
| JP | 5-259298 A | * | 10/1993 |
| JP | 11-26725 | * | 1/1999 |

* cited by examiner

Primary Examiner—Nathan J. Flynn
Assistant Examiner—Ahmed N. Sefer
(74) Attorney, Agent, or Firm—Winstead Sechrest & Minick P.C.

(57) ABSTRACT

A method and system for insulating a lower layer of a semiconductor device from an upper layer of the semiconductor device is disclosed. The method and system include providing an interlayer dielectric on the lower layer. The interlayer dielectric is capable of gap filling while using only species of relatively low mobility. The method and system also include planarizing a surface of the interlayer dielectric.

5 Claims, 5 Drawing Sheets

METHOD AND SYSTEM FOR REDUCING CHARGE GAIN AND CHARGE LOSS IN INTERLAYER DIELECTRIC FORMATION

This Application claims the benefit of No. 60/168,268, filed Nov. 30, 1999.

FIELD OF THE INVENTION

The present invention relates to semiconductor devices, such as flash memory devices, more particularly to a method and system for removal of the antireflective-coating layer.

BACKGROUND OF THE INVENTION

A conventional semiconductor device, such as a conventional flash memory, includes several layers of components. For example, memory cells in a memory region of the semiconductor device may be in the layer of components on and just above the substrate. Components in subsequent layers should be electrically insulated from components in layers above and below except where electrical connection is specifically desired to be made. The layer that isolates distinct layers is known as the conventional interlayer dielectric ("ILD"). Electrical connection to lower layers is made using conventional contacts which extend through the ILD.

FIG. 1 is a flow chart depicting a conventional method 10 for fabricating a portion of a conventional semiconductor device, such as a conventional embedded flash memory. Components in lower layer are fabricated, via step 12. For the first conventional ILD, the lower layer is the layer just above the substrate. Thus, step 12 could include fabricating the memory cells in the first layer of the semiconductor device. A conventional ILD consisting of borophospho-tetraethylorthosilicate ("BPTEOS") or borophospho-silicate glass ("BPSG") is then provided, via step 14. Thus, the conventional ILD is typically B and P doped TEOS or a B and P doped silicate glass. Typically, contact is made to various portions of the lower layer through the conventional ILD. Thus, conventional contacts are fabricated, via step 16. The conventional ILD layer is then planarized, via step 18. Typically, step 18 includes providing a chemical mechanical polish ("CMP"). Processing of the conventional semiconductor device then continues, via step 20. Step 20 typically includes fabricating components for subsequent layers and the conventional ILD layers that separate subsequent layers.

FIG. 2 depicts a portion of a conventional semiconductor device 20 after the first ILD 60 is formed. The conventional semiconductor device 20 includes memory cells 30, 40 and 50. The memory cells 20 and 30 share a common drain 22. The memory cells 40 and 50 share a common source 26. Also depicted are source 24 and drain 28. The conventional ILD 60 includes conventional contacts 62 and 64. The memory cells 30, 40 and 50 include a floating gate 32, 42 or 52, respectively, separated from the substrate 21 by a thin insulating layer 31, 41 or 51, respectively. The memory cells 30, 40 and 50 also include a control gate 34, 44 and 54, respectively separated from floating gates 32, 42, and 52, respectively by insulating layers 33, 43 and 53, respectively. The memory cells 30, 40 and 50 also include spacers 36 and 38, 46 and 48, and 56 and 58, respectively.

Although the conventional method 10 can be used for fabricating the conventional semiconductor device 20, one of ordinary skill in the art will readily understand that the conventional method 10 results charge gain and charge loss issues due to the use of BPSG or BPTEOS for the conventional ILD. BPSG and BPTEOS contain boron, which is highly mobile. Because boron is mobile, the conventional ILD 60 can fill gaps such as the space between the memory cell 40 and the memory cell 50. Thus, boron is used to allow the conventional ILD 60 to fill in gaps, providing a relatively planarized conventional ILD 60.

Although the presence of boron allows the conventional ILD to fill gaps in the lower layer, the mobility of boron may also allow charge to move through the conventional ILD 60. As a result, components in the semiconductor device 20 may unexpectedly gain or lose charge. For example, the memory cell 30, 40 or 50 may gain charge when a user does not desire the memory cell 30, 40 or 50 to store charge. Similarly, a charge stored on the floating gate of the memory cell 30, 40 or 50 may leak away when the user desires the memory cell 30, 40 or 50 to store a charge. For example, a charge intentionally stored on the floating gate 42 may bleed away. The cells 30, 40 or 50 may be subject to unanticipated charge gain and charge loss. As a result, the cells 30, 40 or 50 may not function as desired.

Accordingly, what is needed is a system and method for providing the semiconductor device in which the unexpected charge gain and unexpected charge loss are reduced. The present invention addresses such a need.

SUMMARY OF THE INVENTION

The present invention provides a method and system for insulating a lower layer of a semiconductor device from an upper layer of the semiconductor device. The method and system comprise providing an interlayer dielectric on the lower layer. The interlayer dielectric is capable of gap filling while using only species of relatively low mobility. The method and system also comprise planarizing a surface of the interlayer dielectric.

According to the system and method disclosed herein, the present invention provides an interlayer dielectric which can fill gaps but does not a highly mobile species, such as boron. Consequently, the undesired charge gain and charge loss are reduced.

DETAILED DESCRIPTION OF THE INVENTION

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional semiconductor devices have multiple layers. Each layer may have several components. For example, the first layer of a semiconductor memory device typically includes several memory cells. Typically, different layers are electrically insulated by a conventional interlayer dielectric ("ILD"). The conventional ILD is typically composed of BPTEOS or BPSG. Boron in the BPTEOS and BPSG helps the conventional ILD to fill gaps in the lower layer and provide a more planarized surface. Typically, however, the conventional ILD must be planarized later in fabrication. In order to make electrical contact between certain components in different layers, conventional contacts are also provided in the conventional ILD.

Although conventional semiconductor devices may function, one of ordinary skill in the art will readily realize that the conventional semiconductor devices may be subject to unanticipated charge gain and charge loss. Although the mobility of the boron in the BPTEOS and BPSG aids in gap filling, the boron remains mobile when deposition of the conventional ILD is complete. As a result, charge is more likely to be carried though the conventional ILD. Components in the conventional semiconductor device may thus unexpectedly gain or lose charge. As a result, the components of the conventional semiconductor device may not function as desired.

The present invention provides a method and system for insulating a lower layer of a semiconductor device from an upper layer of the semiconductor device. The method and system comprise providing an interlayer dielectric on the lower layer. The interlayer dielectric is capable of gap filling while using only species of relatively low mobility. The method and system also comprise planarizing a surface of the interlayer dielectric.

The present invention will be described in terms of a particular device having certain components and particular techniques for performing certain steps. However, one of ordinary skill in the art will readily recognize that this method and system will operate effectively for other devices having other components and other techniques. Furthermore, the present invention will be described in terms of a particular semiconductor memory device. However, nothing prevents the method and system from being utilized with another semiconductor device.

Figure 1:
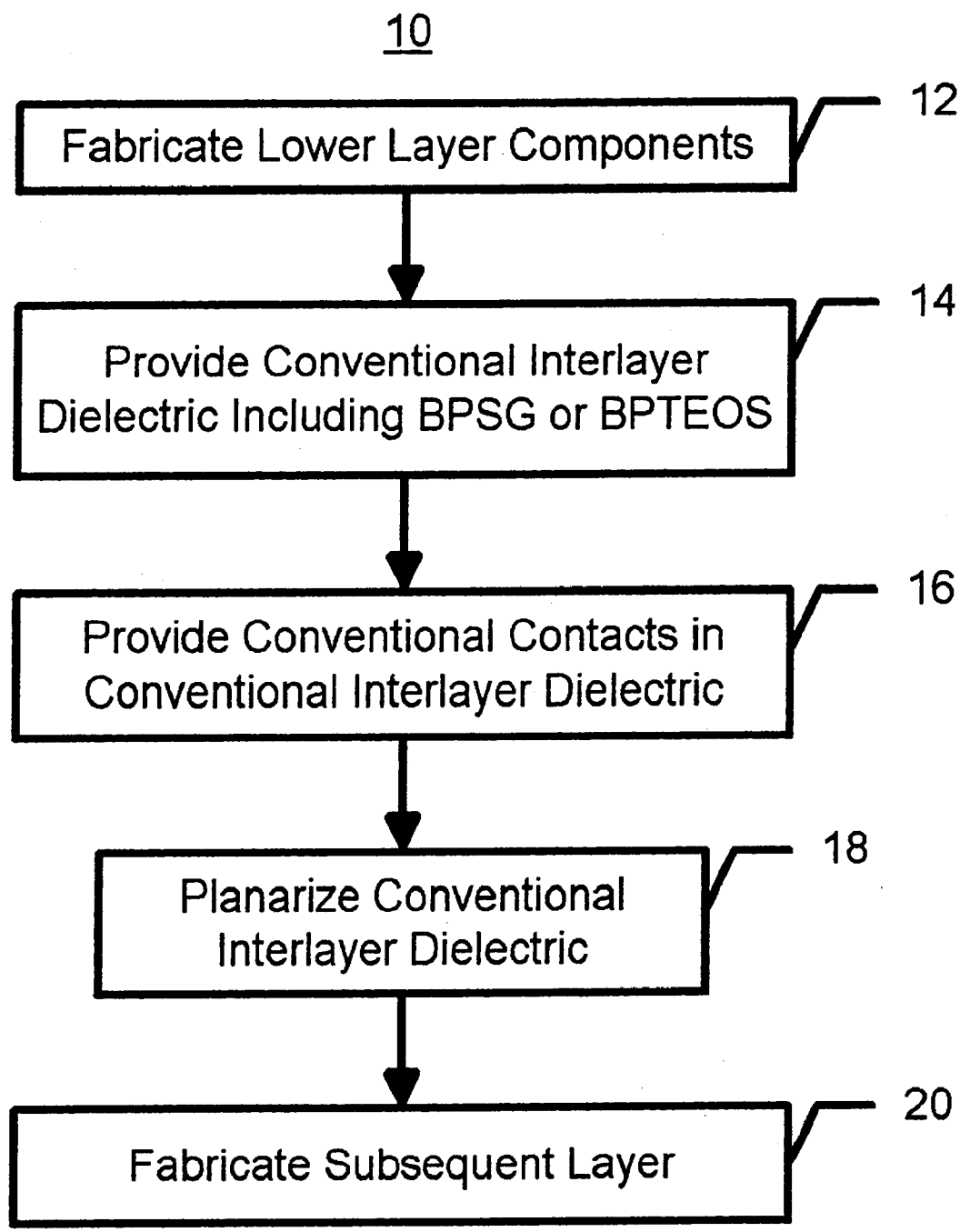
FIG. 1 is a flow chart of a conventional method for providing a portion of semiconductor device
Figure 2:
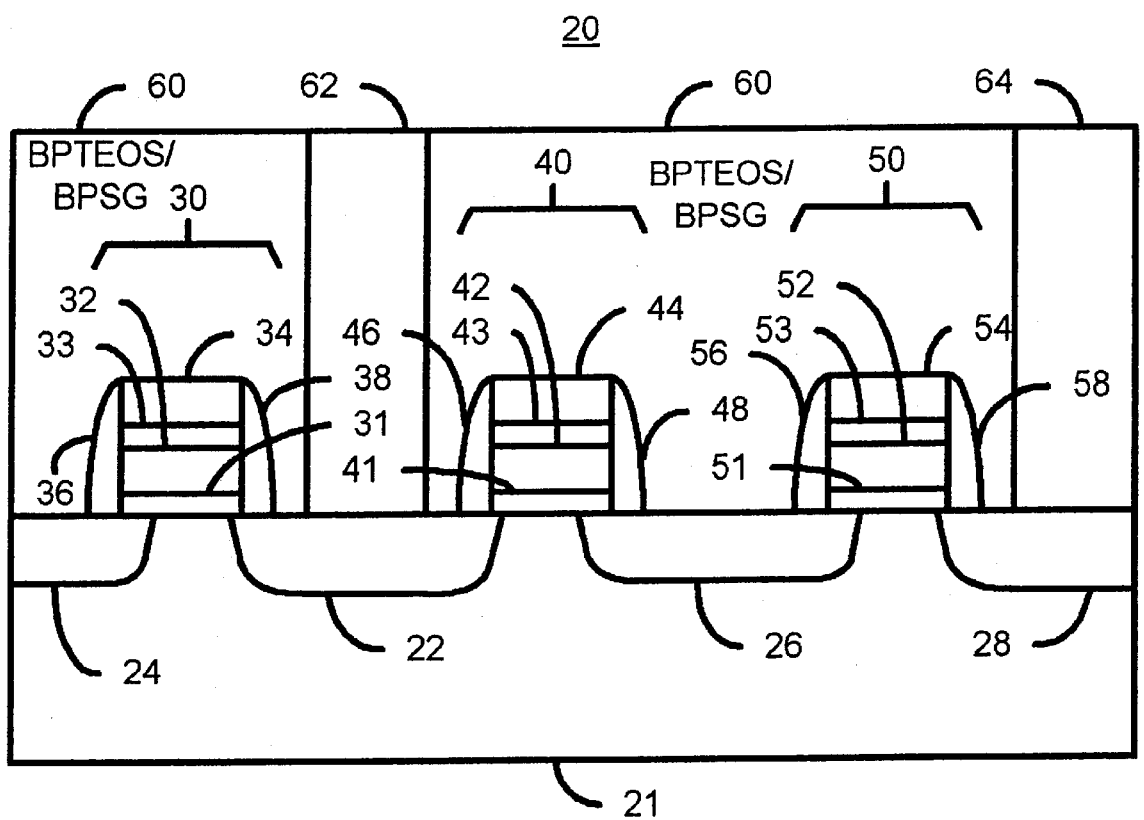
FIG. 2 is a side view of a conventional semiconductor device during fabrication, prior to removal of the antireflective coating layer.
Figure 3A:
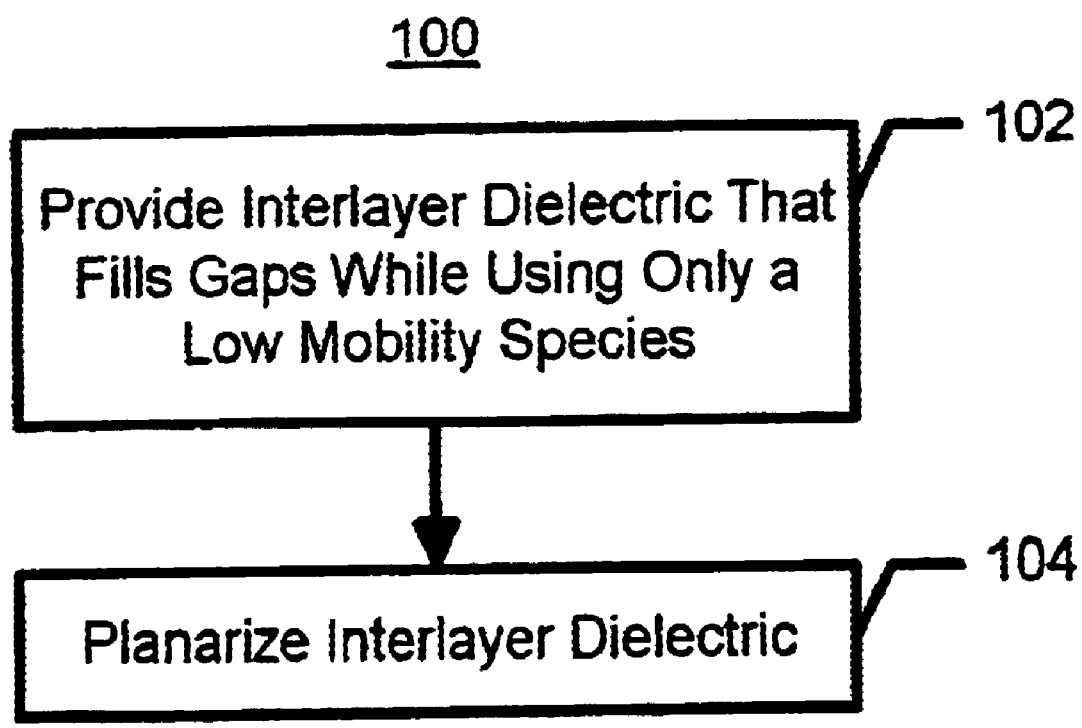
FIG. 3A is a flow chart depicting one embodiment of a method in accordance with the present invention for insulating a lower layer of a semiconductor device from the upper layer of the semiconductor device.

To more particularly illustrate the method and system in accordance with the present invention, refer now to FIG. 3A depicting one embodiment of a method 100 in accordance with the present invention for insulating one layer of the semiconductor device from another layer. The layers being insulated are described as a lower layer and an upper layer. Thus, the method 100 preferably commences after fabrication of the lower layer has been completed. An ILD which can fill gaps in the lower layer using only a lower mobility species is provided on the lower layer, via step 102. Higher mobility species, such as boron, are thus not present in the ILD provided in step 102. In a preferred embodiment, the species used in the ILD of step 102 have a lower mobility than boron. At the same time, the ILD deposited in step 102 can provide at least some of the gap filling of the conventional ILD 60 of FIG. 2 without using boron. In a preferred embodiment, step 102 includes depositing P doped TEOS or TEOS using high density plasma ("HDP") deposition. The HDP deposition is preferably carried out in a chemical vapor deposition ("CVD") deposition system using a higher density, oxide plasma. Because HDP deposition is used, the ILD deposited in step 102 provides relatively good gap filling and a fairly planar surface.

The ILD can be planarized, via step 104. Step 104 is performed because even though the ILD deposited in step 102 can provide gap filling, the top surface of the ILD may still not be as planar as desired. Fabrication of the semiconductor device may then be completed, via step 106. Step 106 preferably includes forming subsequent layers and any ILD layers insulating subsequent layers. In one embodiment, step 106 can include completing processing of the semiconductor device using conventional techniques.

Figure 3B:
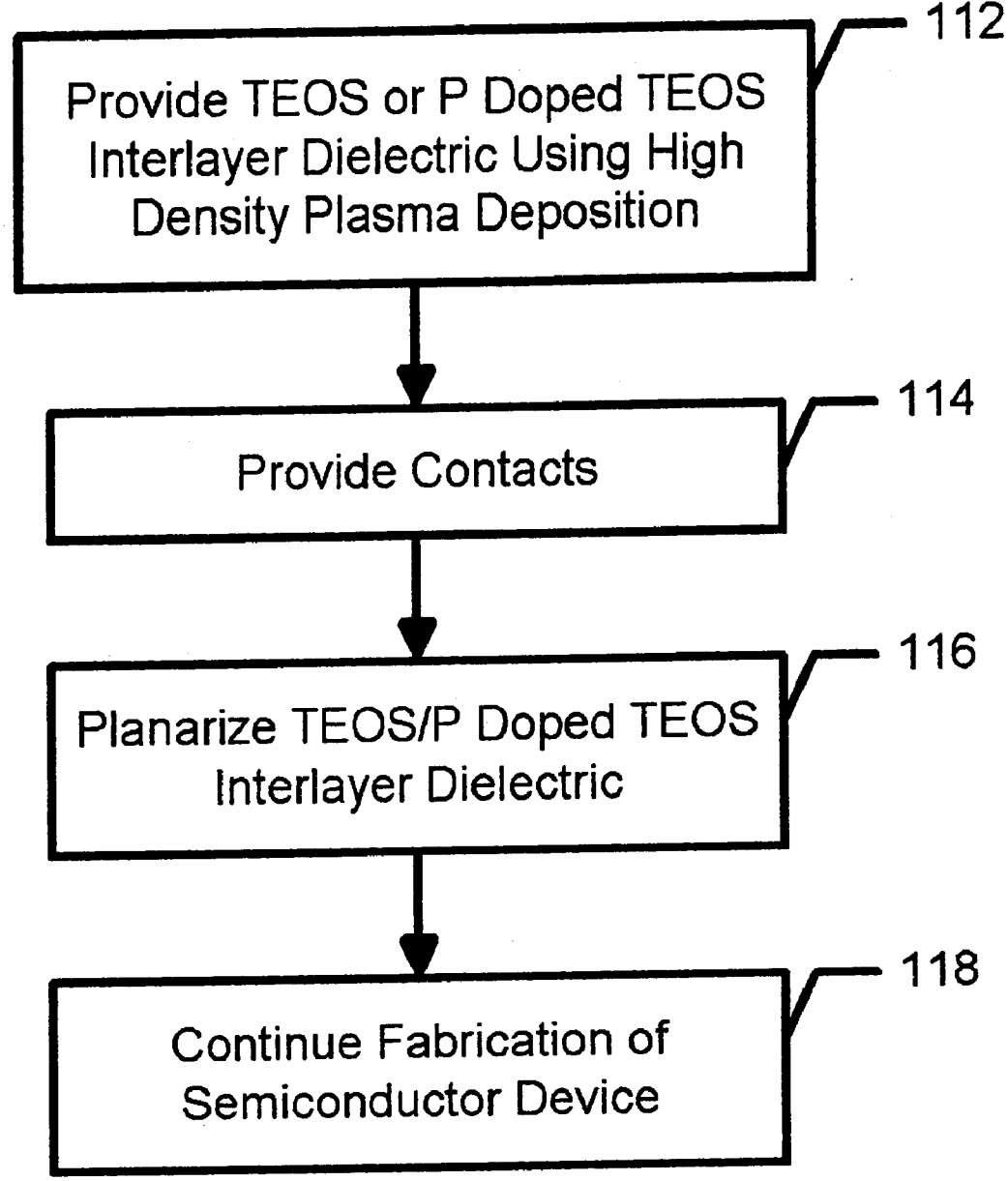
FIG. 3B is a more detailed flow chart of one embodiment of a method in accordance with the present invention for insulating a lower layer of a semiconductor device from the upper layer of the semiconductor device.

FIG. 3B depicts a more detailed flow chart of a method 110 for providing a semiconductor device in accordance with the present invention. The method 110 also preferably commences after the lower layer of the semiconductor device has been completely fabricated. The ILD is deposited using HDP deposition, preferably in a CVD deposition system, via step 112. Preferably, the ILD is composed of P doped TEOS or TEOS. However, another ILD having species of a relatively low mobility, less than that of to boron, may be used. Contacts to components of the lower layer are then provided through the ILD, via step 114. Generally, step 114 includes providing a photoresist structure having apertures where the contacts are desired, etching via holes, and filling the via holes with a conductive material. Step 114 may also include using an antireflective coating ("ARC") layer on the ILD to be better able to provide contacts having the desired dimensions. The ILD is planarized, via step 116. Step 116 is performed because even though the ILD deposited in step 112 can provide gap filling, the top surface of the ILD may still not be as planar as desired. Step 116 may also include removing an excess conductive material used to form the contacts in step 114. Fabrication of the semiconductor device then continues, via step 118. Step 118 may include forming components of subsequent layers and the subsequent ILD between the subsequent layers.

Figure 4:
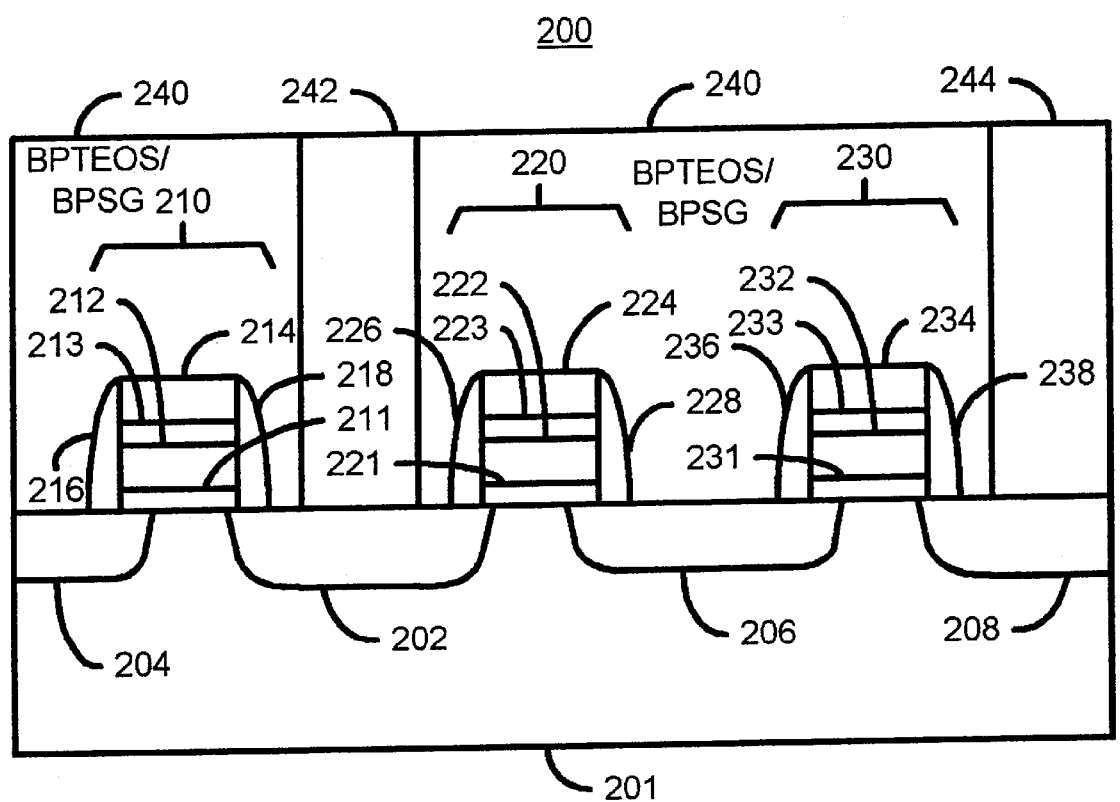
FIG. 4 is a side view of a conventional semiconductor device in accordance with the present invention.

FIG. 4 depicts a portion of a semiconductor device 200 in accordance with the present invention during fabrication. In particular, FIG. 4 depicts the semiconductor device 200 after the first ILD 240 has been formed. The semiconductor device 200 includes memory cells 210, 220 and 230. The memory cells 210 and 220 share a common drain 202. The memory cells 230 and 240 share a common source 206. Also depicted are source 204 and drain 208. The ILD 240 includes conventional contacts 242 and 244. The memory cells 210, 220 and 230 include a floating gate 212, 222 and 232, respectively, separated from the substrate 201 by a thin insulating layer 211, 221 or 231, respectively. The memory cells 210, 220 and 230 also include a control gate 214, 224 and 234, respectively separated from floating gates 212, 222, and 232, respectively by insulating layers 213, 223 and 233, respectively. The memory cells 210, 220 and 230 also include spacers 216 and 218, 226 and 228, and 236 and 238, respectively.

The ILD 240 can fill gaps in the lower layer, which includes memory cells 210, 220, and 230, using only a lower mobility species. Higher mobility species, such as boron, are thus not present in the ILD 240. In a preferred embodiment, the species that can be used in the ILD 240 have a lower mobility than boron. At the same time, the ILD 240 provides at least some of the gap filling of the conventional ILD 60 of FIG. 2. Referring back to FIG. 4, the ILD 240 provides this gap-filling ability without the use of boron. In a preferred embodiment, the ILD 240 provides P doped TEOS or TEOS provided using HDP deposition.

A method and system has been disclosed for providing an ILD having gap-filling capabilities without the use of a high mobility species, such as boron. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device including a lower layer and an upper layer, the semiconductor device comprising:

an interlayer dielectric between the lower layer and the upper layer, the interlayer dielectric capable of gap-filling and having at least one dopant, each of the at least one dopant being of a species of relatively low mobility, the interlayer dielectric further consisting of a P doped TEOS layer provided using high density plasma deposition;

plurality of contacts through the interlayer dielectric, the plurality of contacts including a conductive material; and wherein the lower layer includes a plurality of memory cells and is a first layer fabricated on the semiconductor device.

2. The semiconductor device of claim 1 wherein the species of relatively low mobility have a first mobility which is less than a second mobility of boron.

3. The semiconductor device of claim 1 wherein the plurality of contacts further include a plurality of W contacts.

4. The semiconductor device of claim 1 wherein the interlayer dielectric is provided using a high density plasma deposition, thereby allowing the interlayer dielectric to fill gaps between the lower layer and the upper layer.

5. The semiconductor device of claim 4 wherein the interlayer dielectric has an upper planar surface due to the high density plasma deposition.

* * * * *

UNITED STATES PATENT AND TRADEMARK OFFICE
CERTIFICATE OF CORRECTION

PATENT NO.    : 6,635,943 B1
DATED         : October 21, 2003
INVENTOR(S)   : Angela T. Hui et al.

It is certified that error appears in the above-identified patent and that said Letters Patent is hereby corrected as shown below:

Column 6,
Line 11, please replace "include" with -- includes --.

Signed and Sealed this

First Day of June, 2004

JON W. DUDAS
*Acting Director of the United States Patent and Trademark Office*